(12) United States Patent
Sakaguchi

(10) Patent No.: US 6,956,195 B2
(45) Date of Patent: Oct. 18, 2005

(54) PHOTOELECTRIC CURRENT AND VOLTAGE CONVERTING CIRCUIT

(75) Inventor: Makoto Sakaguchi, Shiga (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/923,720

(22) Filed: Aug. 24, 2004

(65) Prior Publication Data

US 2005/0045807 A1    Mar. 3, 2005

(30) Foreign Application Priority Data

Aug. 25, 2003  (JP) .............................. 2003-299435

(51) Int. Cl.[7] .............................................. H01J 40/14
(52) U.S. Cl. ............................ 250/214 A; 250/214 R; 330/110
(58) Field of Search ........................ 250/214 R, 214 A, 250/214 LA, 214 AG, 214 C, 214 DC, 551; 330/59, 110, 308, 260; 327/514

(56) References Cited

U.S. PATENT DOCUMENTS

| 5,061,859 | A | | 10/1991 | Lovelace et al. |
| 5,287,107 | A | * | 2/1994 | Gampell et al. ............ 341/137 |
| 5,406,071 | A | | 4/1995 | Elms |
| 6,166,566 | A | | 12/2000 | Strong |

FOREIGN PATENT DOCUMENTS

| GB | 2031630 A | 4/1980 |
| JP | S63-236971 A | 10/1988 |
| JP | 3121339 B2 | 10/2000 |

* cited by examiner

Primary Examiner—Kevin Pyo
(74) Attorney, Agent, or Firm—Sughrue Mion, PLLC

(57) ABSTRACT

A photoelectric current and voltage converting circuit includes a light receiving element, an amplifier, a feedback resistor, an offset resistor, a constant current source, and a comparator. A feedback resistor is connected between the input and the output of the amplifier and converts photo current into voltage. An terminal of the offset resistor is connected to the output of the amplifier. The constant current source is connected to another terminal of the offset resistor. The comparator compares the connected point of the offset resistor and the constant current source with a reference voltage and outputs a binary signal. The reference voltage is an input voltage of the amplifier or the divided voltage of the intermediate point of the feedback resistor.

1 Claim, 4 Drawing Sheets

PHOTOELECTRIC CURRENT AND VOLTAGE CONVERTING CIRCUIT

BACKGROUND OF THE INVENTION

1. Field of the Invention

The present invention relates to a photoelectric current and voltage converting circuit which converts a photoelectric current generated from a light-receiving element into voltage and outputs the voltage as a binary signal.

2. Description of the Related Art

A photoelectric current and voltage converting circuit, which converts a photoelectric current generated from a light receiving element into voltage, such as a photodiode, and outputs the voltage as a binary signal, is applied in various technical fields.

For example, the photoelectric current and voltage converting circuit is used in a light reception circuit of a photo-coupler in order to isolate an input and output electrically as Factory Automation.

The photo-coupler supplies a light emitting element (e.g. a light-emitting diode) on input side with an electric signal to transmit a light signal from the light emitting element to a light receiving element on output side, and outputs an electric signal from the light receiving element.

This kind of photoelectric current and voltage converting circuit is made into an IC and is used as a light receiving IC.

Hereinafter, a photoelectric current and voltage converting circuit 200 is explained as a conventional technique with reference to FIG. 1.

The photoelectric current and voltage converting circuit 200 includes a photodiode 1, an amplifier 12, a reference voltage circuit 16, a voltage divider circuit 20, and a comparator 30. Here, an anode is grounded to the photodiode 1.

The amplifier 12 includes an inverting amplifier 13, a non inverting input terminal of which inputs a voltage source 15 (voltage is described as "Vo") based on voltage of the ground. A cathode of the photodiode 1 is connected to an inverting input, and a feedback resistor 14 is connected between the inverting input terminal and the feedback resistor 14.

The reference voltage circuit 16 includes a non inverting amplifier 17 as an operational amplifier. An offset resistor 18 is connected between an inverting input and an output. The inverting input is grounded through a constant current source 19, and the non inverting input terminal is connected to the inverting input of the inverting amplifier 13.

As for the voltage divider circuit 20, a resistor 21 and a resistor 22 are connected in series with the outputs of the amplifier 12 and the reference voltage circuit 16. The series connection point is grounded through a condenser 23.

Further, as for the comparator 30, the non inverting input of which is connected to the output of the amplifier 12. The inverting input of the comparator 30 is connected to the connection points of the first resistor 21 and the second resistor 22.

An operation of the photoelectric current and voltage converting circuit 200 having such constitution will be described bellow.

A photoelectric current Ipd is never generated without light-input to the photodiode 1.

Therefore, the photoelectric current Ipd does not flow through the feedback resistor 14 in the amplifier 12. As a result, the voltages of the output and the inverting input in the amplifier 12 becomes equal, and also becomes equal to the voltage Vo of the non inverting input in the amplifier 12 by a virtual short.

On the other hand, on the reference voltage circuit 16, an offset voltage Vos is generated by the offset resistor 18 and the constant current source 19.

A higher voltage is outputted as a reference voltage Vref (=Vo+Vos) than the voltage of the inverting input in the inverting amplifier 13.

The higher voltage to be outputted is offset according to the difference of the offset voltage Vos.

The voltage between the outputs of the amplifier 12 and the reference voltage circuit 16 is divided by the first and second resistors 21 and 22 in the voltage divider circuit 20 to develop a threshold voltage Vth.

Therefore, when the voltage Va=Vo on the output in the amplifier 12 is outputted, the voltage is compared to the threshold voltage Vth by comparator 30.

Here, the output voltage Vo of the amplifier 12 is lower than the threshold voltage Vth.

As a result, the binary signal in the Low level is outputted as an output signal Vout from the comparator 30 in the photoelectric current and voltage converting circuit 200 shown in FIG. 1.

On the contrary, the photoelectric current Ipd is generated by the light-input to the photodiode 1 in response to the quantity of light.

The photoelectric current Ipd flows through the feedback resistor 14 in the direction of the inverting input from the output of the inverting amplifier 13.

As a result, the voltage of the photoelectric current Ipd is converted into a voltage Vr=Ipd×Rf (the Rf means resistance value of the feedback resistor 14) between the two edges of the feedback resistor 14, and then the voltage Va on the output develops Va=Vo+Vr. When this voltage Va is outputted to the comparator 30 from the output of the amplifier 12, the voltage is compared with the threshold Vth from the voltage divider circuit 20.

When the intensity of the light-input to the photodiode 1 is lager than a certain level, the voltage Va develops larger than the threshold Vth, then, judged as being input a signal.

As a result, on the contrary of the above mentioned case of no light-input, a binary signal in the high level is outputted.

On the other hand, the quantity of the light input to the photodiode 1 is less than the certain level, the voltage Va becomes less than the threshold Vth, and then, a binary signal in the same level as the case without the light-input is outputted. (Refer to Japanese Patent JP B 3121339)

The operation of the photoelectric current and voltage converting circuit is explained bellow referring to the FIG. 2.

The output voltage Va of the amplifier 12 varies from Vo to Vo+Vr as shown in FIG. 2A. On the other hand, the reference voltage Vref has no relation to Ipd and is equal to $V_0$+Vos. This reference voltage Vref and output voltage Va is divided by the first resistor 21 and the second resistor 22 and delayed by the condenser 23 and develops the threshold voltage Vth as shown in FIG. 2A.

FIG. 2A shows the timing chart under the condition that the ratio of the first resistor and the second resistor is about 1 to 2 as described in the Japanese Patent JP B 3121339. The output of the comparator 30 changes after rising and trailing of the output Va of the amplifier 12. Then the output signal Vout of the comparator 30 becomes the form as shown in FIG. 2B.

In the case of the conventional circuit 200, the threshold voltage Vth is generated using the reference voltage circuit 16 including the non inverting amplifier and the voltage divider circuit, the size of a chip is large so that the cost for making such circuit becomes high.

SUMMARY OF THE INVENTION

Therefore, an object of the present invention is to provide a photoelectric current and voltage converting circuit which generates non inverting input and inverting input to a comparator in simpler circuit constitution.

In an aspect of the present invention, a photoelectric current and voltage converting circuit includes a light receiving element which receives light to generate a photo current, an amplifier having an input and an output and converting the photo current into a voltage, a feedback resistor connected between the input and the output, an offset resistor that one terminal is connected to the output, a constant current source connected to an another terminal of the offset resistor, and a comparator comparing a voltage of a connecting point of the offset resistor and the constant current source with a reference voltage to output a binary signal, wherein the reference voltage is an input voltage of the amplifier or a divided voltage of an intermediate point of the feedback resistor.

The photoelectric current and voltage converting circuit according to the present invention, the output voltage of the inverted amplifier or the divided voltage of the intermediate position of the feedback resistor are compared with the voltage which is obtained by making constant current flow through the offset resistor connected to the output of the inverted amplifier.

According to the present invention, an non-inverted input and inverted input of the comparator in the photoelectric current and voltage converting circuit is realized by a simple circuit structure.

DESCRIPTION OF THE PREFERRED EMBODIMENTS

Figure 1:
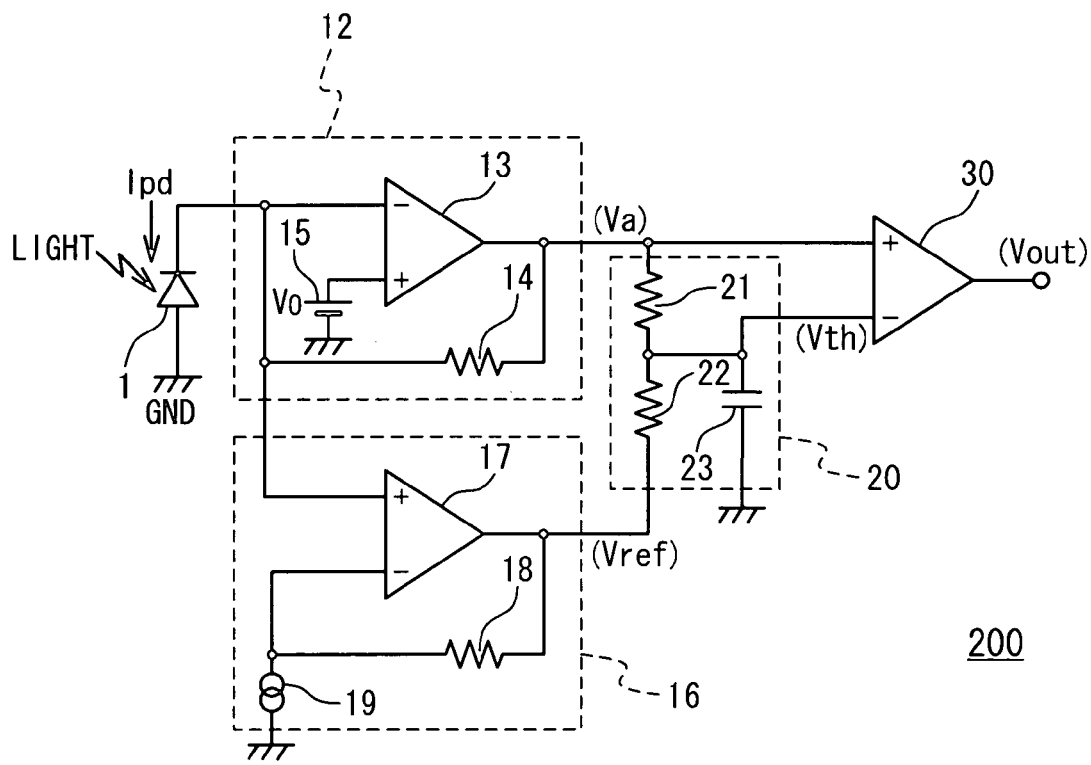
FIG. 1 is a circuit diagram of the light receiving IC according to a conventional technique.
Figure 2A:
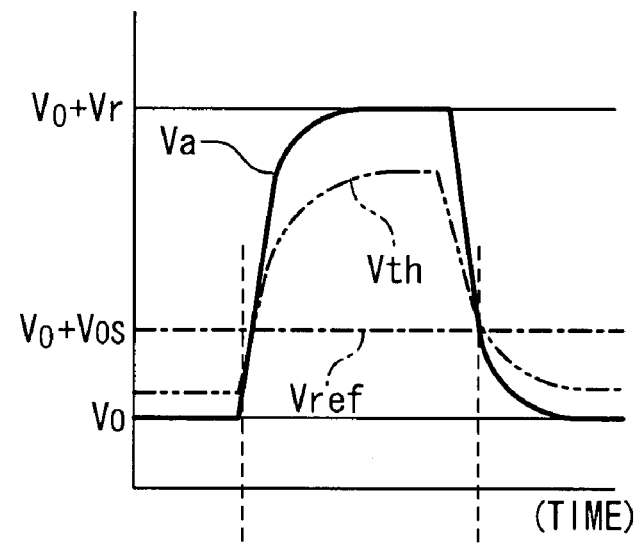
FIGS. 2A and 2B are timing charts for explaining the operation of the light receiving IC described in FIG. 1.
Figure 2B:
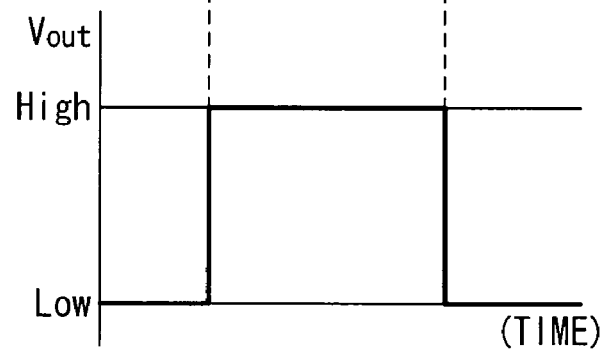
Figure 3:
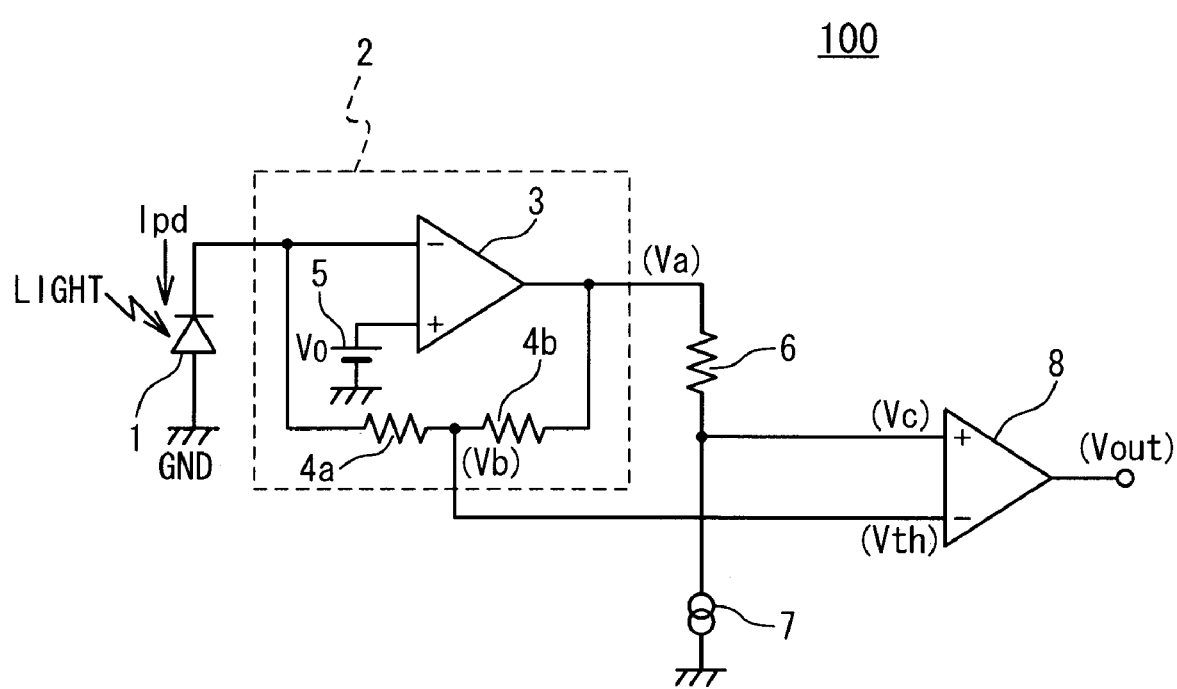
FIG. 3 is a circuit diagram of the light receiving IC according to the first embodiment of the present invention.

Hereinafter, a first embodiment of the photoelectric current and voltage converting circuit 100 of the present invention is described bellow with reference to figures.

The photoelectric current and voltage converting circuit 100 includes a photodiode 1, an amplifier 2, an offset resistor 6, and a comparator 8. Here, an anode of the photodiode is grounded.

The amplifier 2 uses an inverting amplifier 3 wherein, a non inverting input inputs a voltage source 5 (voltage is described as "Vo") based on voltage of the ground. A cathode of the photodiode 1 is connected to an inverting input, and a feedback resistors 4a and 4b are connected in series between the inverting input and the output.

One side of the offset resistor 6 is connected with the output of the inverting amplifier 3, and the other is grounded through a constant current source 7.

The non inverting input of the comparator 8 connects to the connection point of the offset resistor 6 and the constant current source 7.

Also, the inverting input connects to the point between the feedback resistor 4a and 4b which are serially connected.

An operation of the photoelectric current and voltage converting circuit 100 having such constitution will be described bellow.

A photoelectric current Ipd is never generated without light-input to the photodiode 1. Therefore, the photoelectric current Ipd does not flow through the feedback resistors 4a and 4b of the amplifier 2. Then, the voltages of the output and the inverting input in the amplifier 12 becomes equal, and also becomes equal to the voltage Vo of the non inverting input in the amplifier 2 by a virtual short.

Then, the voltage Vo becomes equal to a division voltage Vb as voltage between the feedback resistor 4a and 4b so as to be inputted to the inverting input of the comparator 8 as a threshold Vth (=Vo).

On the other hand, the inverting amplifier 3 is a normal operational amplifier circuit, and an output impedance is near to zero boundlessly. Therefore, a direct current level for the output voltage Va of the amplifier 2 can be shifted only by flowing a constant current from the constant current source 7 to the offset resistor 6.

As a result, a low voltage Vc (=Vo−Vos), which is shifted in accordance with the offset voltage Vos by the offset resistance 6 and the constant current source 7, is inputted to the non inverting input of the comparator 8.

The comparator 8 compares the voltage Vc (=Vo−Vos) and the threshold voltage Vth (=Vo), and the voltage Vc is lower than threshold voltage Vth. Therefore, a binary signal in the low level is outputted from the comparator 8 as an output signal Vout.

On the contrary, the photoelectric current Ipd is generated by the light-input to the photodiode 1 according to the quantity of light.

The photoelectric current Ipd flows through the feedback resistors 4a and 4c in the direction of inverting input from the output of the inverting amplifier 3.

As a result, the photoelectric current Ipd is converted into voltage Vr=Ipd×Rf (Rf: the sum of the resistance value of the feedback registers 4a and 4b).

The voltage Va on the output in the amplifier 2 develops Va=Vo+Vr.

The voltage Va is offset according to the difference of the offset voltage Vos by the offset resistor 6 and the constant current source 7, and is inputted to the non inverting input of the comparator 8 as a lower voltage Vc (=Vo+Vr−Vos).

On the other hand, the voltage Vr between the inverting input and the output of the amplifier 2 is divided according to the resistance ratio of the feedback resistor 4a and 4b to add the voltage Vo, and becomes to be a division voltage Vb.

The division voltage Vb is inputted to the inverting input of the comparator 8 as a threshold voltage Vth.

When the quantity of the light-input to the photodiode 1 is lager than a certain level, the voltage Vc develops larger than the threshold Vth, then, judged as being input a signal. As a result, on the contrary of the above mentioned case of no light-input, a binary signal in the high level is outputted.

On the other hand, the quantity of the light-input to the photodiode 1 is less than the certain level, the voltage Vc becomes less than the threshold Vth, and then, a binary signal in the same level as the case without the light-input is outputted.

Hereinafter, an operation of the photoelectric current and voltage converting circuit 100 is described bellow with reference to a curve and line charts shown in FIG. 4.

Figure 4A:
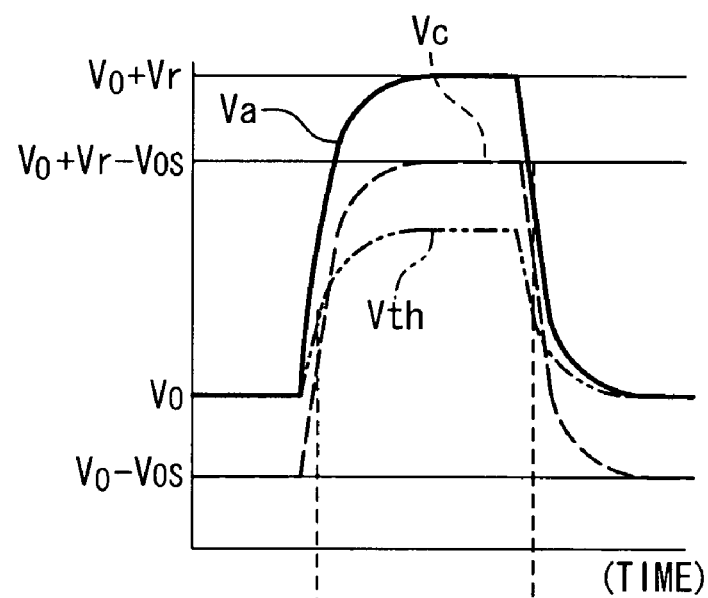
FIGS. 4A and 4B are timing charts for explaining the operation of the light receiving IC described in FIG. 3.

First of all, as shown in FIG. 4A, the output voltage Va in the amplifier 2 changes at the range from voltage Vo+Vr to Vo corresponding to strength of the photoelectric current.

It is the voltage Vc shown in FIG. 4A that the level of the output voltage Va is offset according to the difference of the offset voltage Vos.

On the other hand, since the voltage Vr (=Ipd×Rf) corresponding to the photoelectric current Ipd is divided according to the resistance ratio of the feedback resistors 4a and 4b, the division voltage Vb is changed into the level of the summation of this divided voltage and the voltage Vo so as to develop the threshold voltage Vth as shown in FIG. 4A.

Figure 4B:
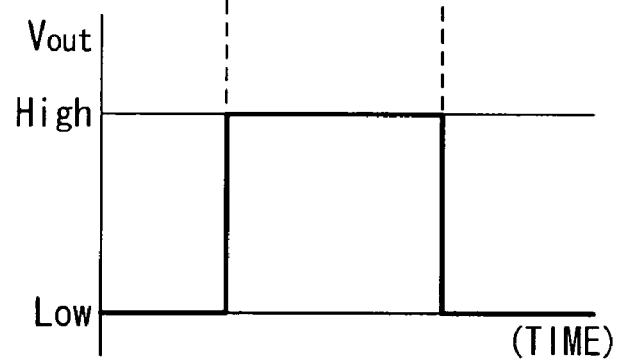

In this way, the output of the comparator 8 is quickly switched just after rising and trailing of the output of the amplifier 2, so that the level of the output signal Vout from the comparator 8 can be described such as the line graph shown in FIG. 4B.

In the photoelectric current and voltage converting circuit of the present invention as described up to this, the division voltage Vb gained from intermediate of the feedback resistors can be adapted as the threshold voltage Vth in the comparator 8 and is compared with the voltage Vc, which is gained by flowing the constant current to the offset resistor 6 connected with the output of the inverting amplifier 3.

Therefore, the photoelectric current and voltage converting circuit can be achieved by a simple circuit constitution without using a divided resistor for generating a threshold voltage to be inputted into a comparator and a non inverting amplifier in the reference voltage circuit such as a conventional circuit.

It should be noted that for the inverting input of the comparator 8, the intermediate voltage of the feedback resistor may be substituted for the voltage on the inverting input in the inverting amplifier 3. In this case, the threshold voltage Vth is constant at the level of the voltage Vo.

Also, the amplifier 2 of the present invention may be constituted as follow. That is, a source of the Nch-type MOS transistor is grounded and a constant current source is connected between a drain and a power supply voltage terminal. The connection point of the drain and the constant current source works as an input of next stage for amplifying. Such plural stages for amplifying are connected in series so as to form an inverting amplifier, and the feed back resistor connect with the input on the first stage and output on the final stage.

Furthermore, if it is needed to invert the output of the binary signal contrary to the first embodiment, it should input the voltage Vc to the inverting input and input the threshold voltage Vth to the non-inverting input on the comparator 8.

The photoelectric current and voltage converting circuit according to the present invention can applies to an infrared-ray communication, an optical receiver circuit like a optical fiber cable communication, a photo detecting circuit which transforms a laser reflected light signal to a electric digital signal used in a recent optical disk device.

What is claimed is:

1. A photoelectric current and voltage converting circuit comprising;

a light receiving element which receives light to generate a photo current;

an amplifier having an input and an output and converting said photo current into a voltage;

a feedback resistor connected between said input and said output;

an offset resistor that one terminal is connected to said output;

a constant current source connected to an another terminal of said offset resistor; and a comparator comparing a voltage of a connecting point of said offset resistor and said constant current source with a reference voltage to output a binary signal, wherein said reference voltage is an input voltage of said amplifier or a divided voltage of an intermediate point of said feedback resistor.

* * * * *